United States Patent
Ide et al.

(10) Patent No.: US 9,349,897 B2
(45) Date of Patent: *May 24, 2016

(54) SOLAR CELL MODULE AND MANUFACTURING METHOD THEREFOR

(71) Applicant: Sanyo Electric Co., Ltd., Moriguchi, Osaka (JP)

(72) Inventors: Daisuke Ide, Kobe (JP); Youhei Murakami, Minoh (JP); Mitsuaki Morigami, Izumiotsu (JP); Ryo Goto, Kobe (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 382 days.

This patent is subject to a terminal disclaimer.

(21) Appl. No.: 13/848,212

(22) Filed: Mar. 21, 2013

(65) Prior Publication Data

US 2013/0213452 A1 Aug. 22, 2013

Related U.S. Application Data

(63) Continuation of application No. PCT/JP2011/071965, filed on Sep. 27, 2011.

(30) Foreign Application Priority Data

Sep. 27, 2010 (JP) .................................. 2010-215916

(51) Int. Cl.
*H01L 31/05* (2014.01)

(52) U.S. Cl.
CPC ............. *H01L 31/0516* (2013.01); *Y02E 10/50* (2013.01)

(58) Field of Classification Search
CPC .................. H01L 31/0516; H01L 31/022433; H01L 31/0201; H01L 31/022441; H01L 31/0508; H01L 31/0504; H01L 31/05; H01L 31/022425; H01L 31/022; H01L 31/0547; H01L 31/0682; Y02E 10/52
USPC ............................................. 136/244; 438/80
See application file for complete search history.

(56) References Cited

U.S. PATENT DOCUMENTS

| | | | |
|---|---|---|---|
| 4,542,258 A | 9/1985 | Francis et al. | |
| 2005/0022857 A1* | 2/2005 | Daroczi et al. | 136/244 |
| 2010/0032014 A1* | 2/2010 | Bettinelli et al. | 136/258 |

(Continued)

FOREIGN PATENT DOCUMENTS

| | | | |
|---|---|---|---|
| JP | 7-99334 A | 4/1995 | |
| JP | 7-231015 A | 8/1995 | |
| JP | 2002-217434 A | 8/2002 | |

(Continued)

*Primary Examiner* — Jeffrey T Barton
*Assistant Examiner* — Michael Y Sun
(74) *Attorney, Agent, or Firm* — Mots Law, PLLC

(57) ABSTRACT

A solar cell module is provided with a plurality of solar cells and a wiring material. Each solar cell includes a p-side electrode and an n-side electrode arranged on one principal surface thereof. For each pair of adjacent solar cells, the wiring material electrically connects the p-side electrode of one solar cell and the n-side electrode of the other solar cell. Surface layers of the p-side electrodes and the n-side electrodes comprises, respectively, plating layers each containing at least one power-supplied point. The wiring material is bonded to the solar cells at regions each of which at least includes the power-supplied point.

10 Claims, 4 Drawing Sheets

(56) References Cited

U.S. PATENT DOCUMENTS

2010/0051085 A1* 3/2010 Weidman et al. ............. 136/244
2010/0139746 A1* 6/2010 Von Maydell et al. ........ 136/255

FOREIGN PATENT DOCUMENTS

| JP | 2008-34592 A | 2/2008 |
| JP | 2009-266848 A | 11/2009 |

* cited by examiner

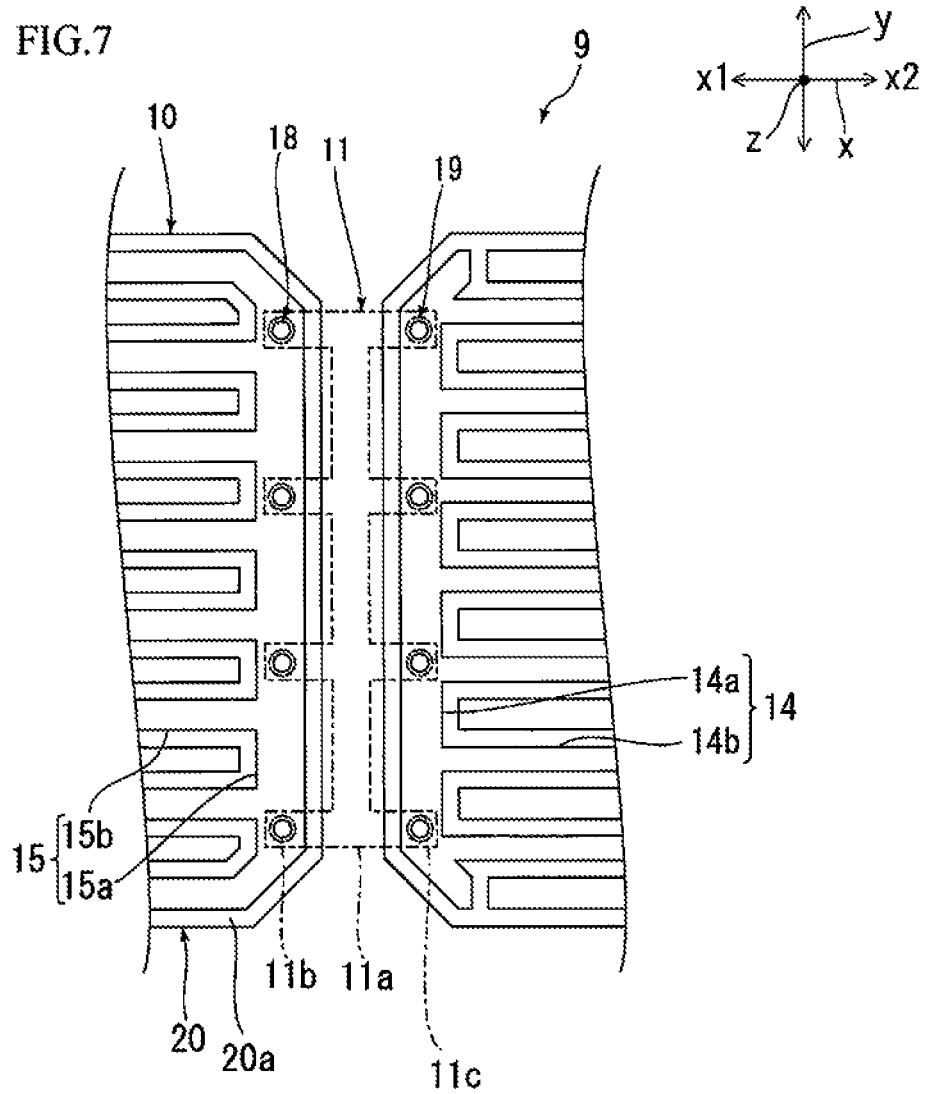

SOLAR CELL MODULE AND MANUFACTURING METHOD THEREFOR

CROSS REFERENCE TO RELATED APPLICATIONS

This application is a continuation application of International Application No. PCT/JP2011/071965, filed on Sep. 27, 2011, entitled "SOLAR CELL MODULE AND MANUFACTURING METHOD THEREFOR", which claims priority based on Article 8 of Patent Cooperation Treaty from prior Japanese Patent Applications No. 2010-215916, filed on Sep. 27, 2010, the entire contents of which are incorporated herein by reference.

BACKGROUND OF THE INVENTION

1. Field of the Invention

This disclosure relates to a solar cell module and a manufacturing method therefor.

2. Description of Related Art

Recently, solar cells have been receiving much attention as an energy source with a low environmental load. Therefore, research and development on solar cells are actively carried out. In particular, how to improve conversion efficiency of solar cell is an important issue. Accordingly, research and development on solar cells having improved conversion efficiency and manufacturing methods therefor are especially active.

A so-called back contact solar cell including a p-type region and an n-type region on a back surface side is proposed in Patent Document 1 listed below as an example of a solar cell with high conversion efficiency. In the back contact solar cell, a light-receiving surface does not necessarily have to be provided with an electrode for collecting carriers. This can improve the light-receiving efficiency in the back contact solar cell. Accordingly, the back contact solar cell can achieve improved conversion efficiency.

Patent Document 1 (Japanese Patent Application Publication No. 2009-266848) states that multiple back contact solar cells as mentioned above are electrically connected to one another by wiring members and a solar cell module is thereby formed. In the solar cell module, the electrical connection of the solar cells by the wiring members can be achieved by using only the back surface side. This allows usage of wiring members with a large width. Accordingly, it is possible to suppress voltage drop due to wiring connection of multiple solar cells by using wiring members.

Patent Document 1: Japanese Patent Application Publication No. 2009-266848

SUMMARY OF THE INVENTION

In a solar cell module using back contact solar cells, all wiring is provided on the back surface sides of the solar cells. Accordingly, when the solar cell module experiences thermal expansion due to temperature rise, all of the stresses applied from the wiring members to the solar cells due to their difference in coefficient of thermal expansion are applied to the back surfaces of the solar cells. Therefore, in the solar cell module using the back contact solar cells, it is important to improve the reliability of bonding between the wiring and the solar cells compared to conventional solar cell modules.

A solar cell module according to one aspect of the invention includes a plurality of solar cells and a wiring member. Each of the plurality of solar cells has a p-side electrode and an n-side electrode which are disposed on one main surface. The wiring member electrically connects the p-side electrode of one of adjacent two of the solar cells and the n-side electrode of the other solar cell to each other. A surface layer of each of the p-side electrodes and the n-side electrodes is formed of a plating layer including at least one power supplied point. The wiring member is bonded to regions of the solar cells which each includes at least the power supplied point.

A manufacturing method for a solar cell module according to another aspect of the invention is related to a manufacturing method for a solar cell module. The solar cell module includes: solar cells each including a p-side electrode and an n-side electrode which are disposed on one main surface; and a wiring member electrically connecting the p-side electrode of one of adjacent two of the solar cells and the n-side electrode of the other solar cell to each other. The manufacturing method for the solar cell module according to this aspect of the invention includes: plating on one main surface of a solar cell by supplying power with a power supply probe in contact with the one main surface of the solar cell and thereby forming a p-side electrode and a n-side electrode on the one main surface such that each of the p-side electrode and the n-side electrode include the plating layer having a power supplied point; and bonding a wiring member to a region of the solar cell including at least the power supplied point.

The aspects of the invention can improve the reliability of a solar cell module.

BRIEF DESCRIPTION OF THE DRAWINGS

FIG. 7 is a schematic cross-sectional view showing part of a solar cell string in a second embodiment.

DETAILED DESCRIPTION OF EMBODIMENTS

First Embodiment

Figure 1:
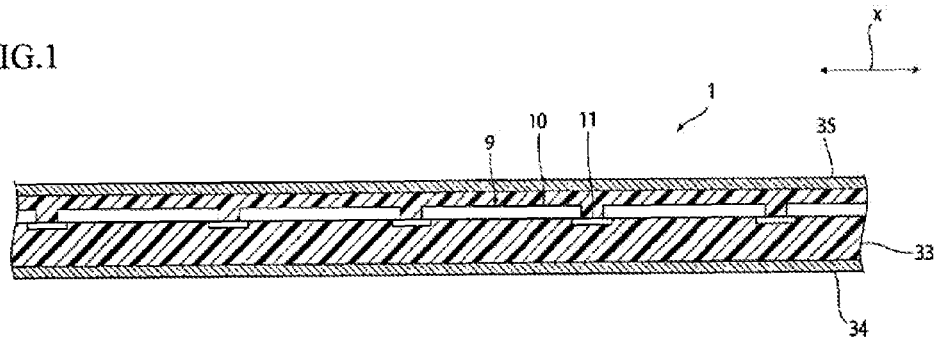
FIG. 1 is a schematic cross-sectional view of a solar cell module of a first embodiment.

Preferable modes for carrying out the invention are described below by taking solar cell module 1 shown in FIG. 1 as an example. Note that solar cell module 1 is merely an example and the invention is not limited to solar cell module 1 at all.

Moreover, members having substantially the same function are referred to by the same reference numerals in the drawings referred in the embodiments and the like. Furthermore, the drawings referred in the embodiments and the like are schematically illustrated. Proportions of dimensions of objects illustrated in the drawings may be different from proportions of dimensions of actual objects. The dimensional proportions and the like of objects may be different among the drawings. Specific dimensional proportions and the like of objects should be determined in consideration of the following description.

(Schematic Configuration of Solar Cell Module 1)

Solar cell module 1 includes solar cell strings 9. Each solar cell string 9 includes multiple back contact solar cells 10 arranged in an x direction (one direction). The multiple solar cells 10 are electrically connected to one another by wiring members 11. Specifically, each adjacent two of solar cells 10 are electrically connected to each other by a corresponding one of wiring members 11 and multiple solar cells 10 are thereby electrically connected in series or in parallel.

First and second protection members 34, 35 are disposed respectively on a back surface side and a light-receiving surface side of multiple solar cells 10. Sealing layer 33 is provided between first protection member 34 and second protection member 35. Multiple solar cells 10 are sealed in sealing layer 33.

Materials of sealing layer 33 and first and second protection members 34, 35 are particularly not limited. Sealing layer 33 may be made of a resin such as ethylene vinyl acetate copolymer (EVA) or polyvinyl butyral (PVB).

First and second protection members 34, 35 may be made of a material such as glass or a resin. Moreover, for example, since there is no need for first protection member 34 disposed on the back-surface side to be translucent, first protection member 34 may be formed of a light blocking member such as resin films with a metal foil such as an aluminum foil inserted therebetween.

(Structure of Solar Cells 10)

Figure 2:
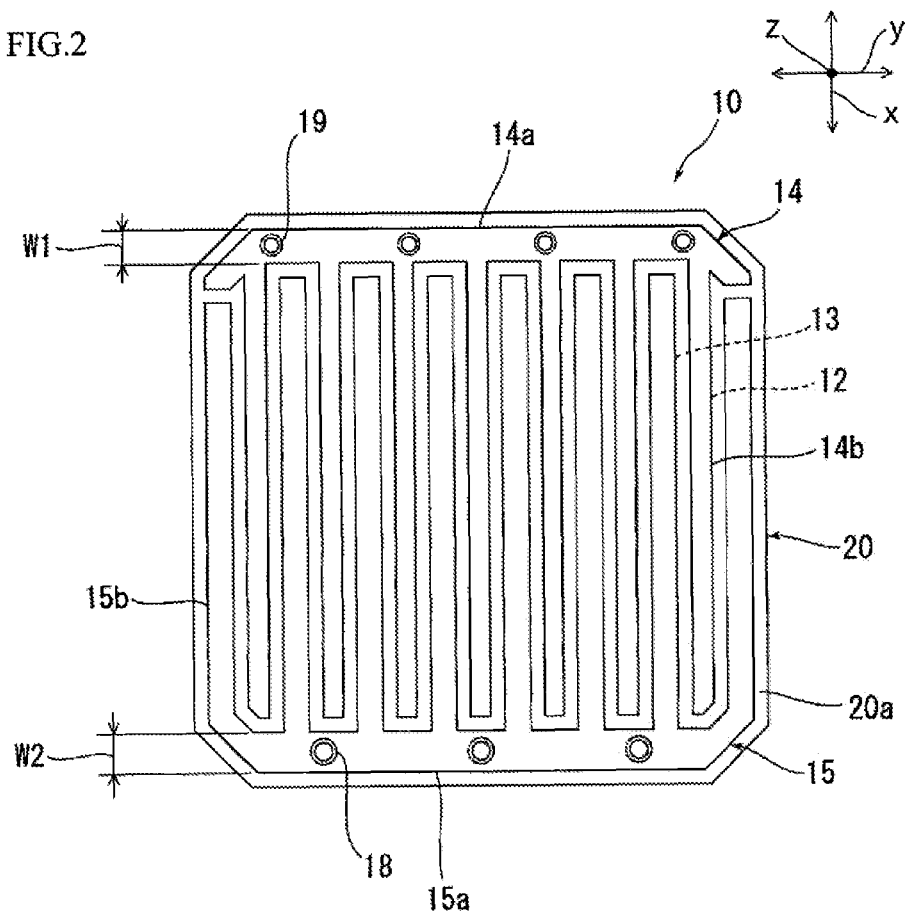
FIG. 2 is a schematic plan view of a solar cell in the first embodiment.

As shown in FIG. 2, each of solar cells 10 includes photoelectric conversion portion 20. Photoelectric conversion portion 20 is particularly not limited as long as photoelectric conversion portion 20 generates carriers (electrons and electron holes) by receiving light. For example, photoelectric conversion portion 20 has a crystalline semiconductor substrate having a first conductivity type as well as a first-conductivity-type region having the first conductivity type and a second-conductivity-type region having a second conductivity type which are disposed on one surface of the crystalline semiconductor substrate. Note that the first conductivity type is either one of p-type and n-type and the second conductivity type is the other one of p-type and n-type.

The first-conductivity-type region can be formed of a semiconductor layer or an impurity diffusion region which includes impurities of the first conductivity type. Similarly, the second-conductivity-type region can be formed of a semiconductor layer or an impurity diffusion region which includes impurities of the second conductivity type.

Moreover, photoelectric conversion portion 20 may include a compound semiconductor layer, an organic semiconductor layer, and the like.

In the embodiment, description is given below of an example in which each photoelectric conversion portion 20 has a crystalline semiconductor substrate with the n-type conductivity.

Figure 4:
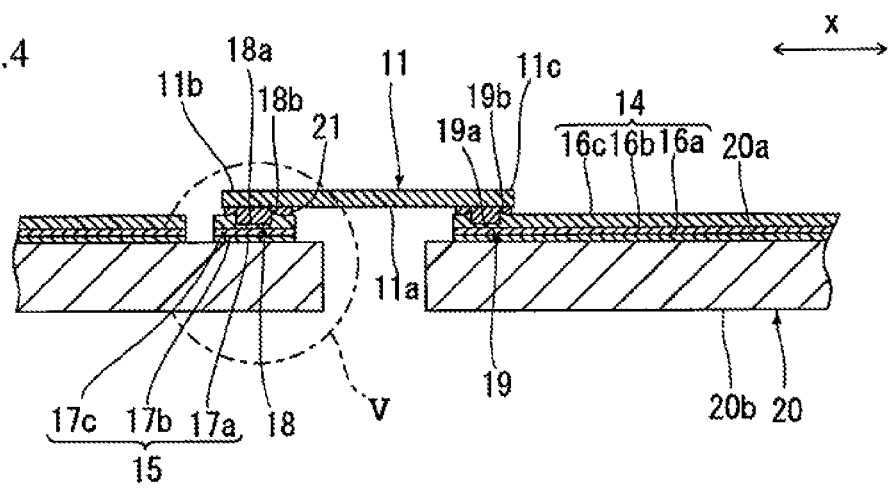
FIG. 4 is a schematic cross-sectional view taken along line IV-IV of FIG. 3.

Each photoelectric conversion portion 20 has back surface 20a and light-receiving surface 20b (see FIG. 4). Back surface 20a includes n-type surface 12 and p-type surface 13. Each of n-type surface 12 and p-type surface 13 is formed in a predetermined pattern. For example, each of n-type surface 12 and p-type surface 13 is formed in a comb shape.

The n-type surface is a surface of an n-type region containing an n-type dopant, the surface exposed to the back surface. The p-type surface is a surface of a p-type region containing a p-type dopant, the surface exposed to the back surface.

On n-type surface 12, there is formed n-side electrode 14 to collect electrons which are majority carriers in the embodiment. Meanwhile, on p-type surface 13, there is formed p-side electrode 15 to collect electrons holes which are minority carriers in the embodiment.

Each of n-side electrode 14 and p-side electrode 15 is formed in a comb shape. Each of n-side electrode 14 and p-side electrode 15 is inserted into gaps of the other one.

Specifically, each of n-side electrode 14 and p-side electrode 15 has bus bar portion 14a, 15a extending in a y direction (other direction) and multiple finger portions 14b, 15b which extend from bus bar portion 14a, 15a in the x direction orthogonal to the y direction. N-side finger portions 14b and p-side finger portions 15b are arranged alternately in the y direction at predetermined intervals. Multiple n-side finger portions 14b are electrically connected to n-side bus bar portion 14a while multiple p-side finger portions 15b are electrically connected to p-side bus bar portion 15a. It is preferable that width W1, in the x direction, of n-side bus bar portion 14a forming part of n-side electrode 14 to collect the majority carriers is smaller than width W2, in the x direction, of p-side bus bar portion 15a forming part of p-side electrode 15 to collect minority carriers. In other words, it is preferable to set width W1 of n-side bus bar portion 14a smaller than width W2 of p-side bus bar portion 15a.

At least a surface layer of each of n-side electrode 14 and p-side electrode 15 is formed of a plating layer. Each of n-side electrode 14 and p-side electrode 15 may be formed entirely of a plating layer. However, in the embodiment, as shown in FIG. 4, each of n-side electrode 14 and p-side electrode 15 is formed of a multilayer including at least conductive layer 16b, 17b and plating layer 16c, 17c stacked on conductive layer 16b, 17b.

When n-type surface 12 and p-type surface 13 include an amorphous semiconductor, each of n-side electrode 14 and p-side electrode 15 may include conductive metal oxide layer 16a, 17a under conductive layer 16b, 17b.

Metal oxide layers 16a, 17a may be made of material such as indium oxide, zinc oxide, or tin oxide which includes a dopant. The thickness of each of metal oxide layers 16a, 17a can be about 20 nm to about 200 nm, for example.

Conductive layers 16b, 17b are used as underlying layers in formation of plating layers 16c, 17c. Moreover, conductive layers 16b, 17b have a function of improving adhesion between metal oxide layers 16a, 17a and plating layers 16c, 17c. Conductive layers 16b, 17b can be made of a metal such as Cu, Sn, Ag, Au, Pt, Pd, Al, Ti, and Ni or a metal alloy including at least one of these metals. Conductive layers 16b, 17b may be each formed of a multilayer including multiple conductive layers. The thickness of each of conductive layers 16b, 17b can be about 50 nm to 500 nm, for example.

Plating layers 16c, 17c can be made of a metal such as Cu or Sn or a metal alloy including at least one of these metals. Plating layers 16c, 17c may be each formed of a multilayer including multiple plating layers. The thickness of each of plating layers 16c, 17c can be about 2 nm to about 50 μm, for example.

In the embodiment, plating layers 16c, 17c are formed by electroplating. Accordingly, each of plating layers 16c, 17c includes at least one power supplied point 18, 19. Specifically, each of plating layers 16c, 17c includes multiple power supplied points 18, 19 arranged at equal intervals. The number of power supplied points 18 in plating layer 17c of p-side electrode 15 is greater than the number of power supplied points 19 in plating layer 16c of n-side electrode 14. Moreover, power supplied points 18 are formed to be smaller than power supplied points 19. Furthermore, multiple power supplied points 18 and multiple power supplied points 19 are provided not to be opposite to each other in the x direction which is the arrangement direction of solar cells 10. Multiple power supplied points 18 and multiple power supplied points 19 are provided asymmetric to each other with respect to a center axis extending in the y direction.

Power supplied points 18, 19 corresponds to points where power supply probes are pressed against the underlying layer in the formation of plating layers 16c, 17c. Accordingly, each of power supplied points 18, 19 includes center portion 18a, 19a which is thinner than portions of plating layer 16c, 17c other than power supplied point 18, 19. Moreover, each of power supplied points 18, 19 includes protruding portion 18b, 19b at the periphery of center portion 18a, 19a which surrounds center portion 18a, 19a and which is thicker than the portions other than power supplied point 18, 19. The thickness of center portion 18a, 19a and the largest thickness of protruding portion 18b, 19b are preferably 0 to 0.5 times and 1.1 to 10 times the thickness of the portions of plating layer 16c, 17c other than power supplied point 18, 19, respectively, more preferably 0 to 0.1 times and 1.1 to 5 times. The ratio of the largest thickness of protruding portion 18b, 19b to the thickness of center portion 18a, 19a (largest thickness of protruding portion 18b, 19b/thickness of center portion 18a, 19a) is preferably 2.2 times to infinite times, more preferably 11 times to infinite times. The depth from a top end of protruding portion 18b, 19b to center portion 18a, 19a is preferably 5 µm to 100 µm, more preferably 10 µm to 50 µm. The diameter of center portion 18a, 19a is preferably, for example, 1 mm to 5 mm, more preferably 2 mm to 3 mm. The width of protruding portion 18b, 19b in a radial direction is preferably, for example, 0.01 mm to 1 mm, more preferably 0.1 mm to 0.5 mm.

In the invention, the shape of each power supplied point is not limited to a circular shape. The shape of each power supplied point may reflect the shape of a front end of the power supply probe and be, for example, a polygonal shape or a triangular shape.

(Electrical Connection of Solar Cells 10 by Wiring Member 11)

Next, detailed description is given of an electrical connection of solar cells 10 in the embodiment.

Figure 3:
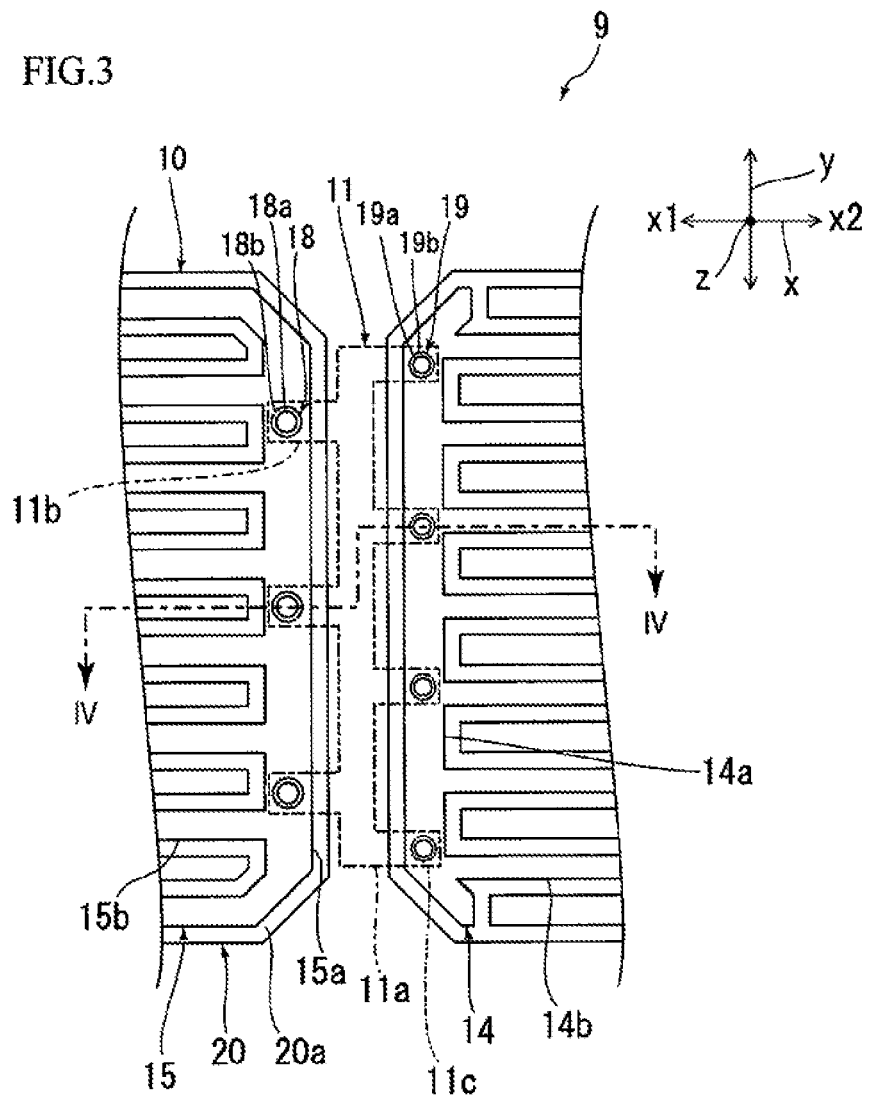
FIG. 3 is a schematic plan view showing part of a solar cell string in the first embodiment.
Figure 5:
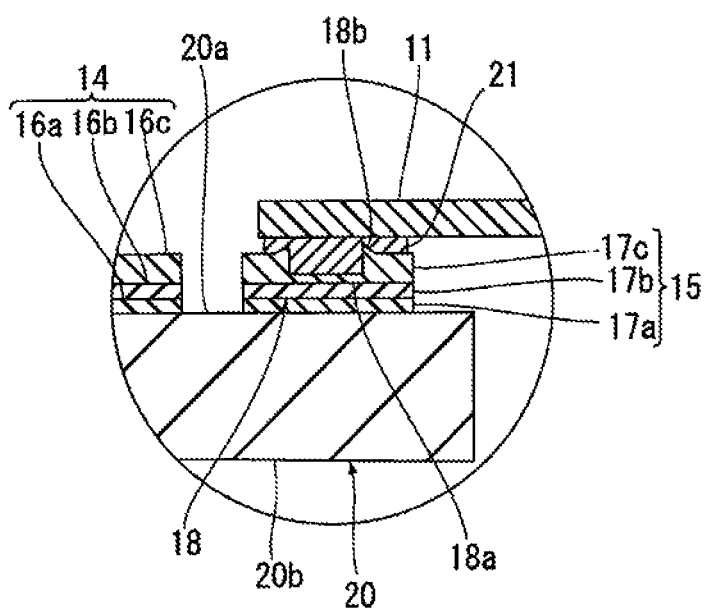
FIG. 5 is a schematic cross-sectional view in which part V of FIG. 4 is enlarged.

As shown in FIGS. 3 to 5, p-side electrode 15 of one of adjacent two solar cells 10 and n-side electrode 14 of the other solar cell 10 are electrically connected to each other by wiring member 11. In the embodiment, wiring member 11 is bonded to p-side electrode 15 of the one solar cell 10 in multiple regions including power supplied points 18 by adhesion layer 21. Moreover, wiring member 11 is bonded to n-side electrode 14 of the other solar cell 10 in multiple regions including power supplied points 19 by adhesion layer 21. The adhesion layer is made of solder or resin adhesive. A conductive resin adhesive or a non-conductive resin adhesive can be used as the resin adhesive. An anisotropic conductive resin adhesive can be preferably used as the conductive resin adhesive. Moreover, when the non-conductive resin adhesive is used, wiring member 11 and n-side electrode 14 as well as wiring member 11 and p-side electrode 15 are brought into direct contact with each other for electrical connection.

Specifically, wiring member 11 includes wiring member main body 11a, multiple first bonding portions 11b, and multiple second bonding portions 11c. Wiring member main body 11a extends in the y direction in a gap between adjacent solar cells 10. Each of multiple first and second bonding portions 11b, 11c extends in the x direction and is electrically connected to wiring member main body 11a. Wiring member main body 11a has such a width that wiring member main body 11a does not come in contact with adjacent solar cells 10. Accordingly, wiring member 11 comes into contact with solar cells 10 only in first and second bonding portions 11b, 11c.

The number of multiple first bonding portions 11b provided is equal to the number of power supplied points 18. Specifically, in the embodiment, since three power supplied points 18 are provided, three first bonding portions 11b are provided. Each of multiple first bonding portions 11b extends from wiring member main body 11a toward an x1 side of the x direction. An x1-side end portion of each of multiple first bonding portions 11b is bonded to a region including a corresponding one of power supplied points 18 by adhesion layer 21 and is thereby electrically connected to p-side electrode 15.

The number of multiple second bonding portions 11c provided is equal to the number of power supplied points 19. Specifically, in the embodiment, since four power supplied points 19 are provided, four second bonding portions 11c are provided. Each of multiple second bonding portions 11c extends from wiring member main body 11a toward an x2 side of the x direction. An x2-side end portion of each of multiple second bonding portions 11c is bonded to a region including a corresponding one of power supplied points 19 by adhesion layer 21 and is thereby electrically connected to n-side electrode 14.

In the embodiment, multiple first bonding portions 11b and multiple second bonding portions 11c are provided in a staggered pattern in the y direction which is an extending direction of wiring member main body 11a. In other words, connection portions of first bonding portions 11b with wiring member main body 11a and connection portions of second bonding portions 11c with wiring member main body 11a are located different positions in the y direction.

Wiring member 11 is particularly not limited as long as it is a conductive member. For example, wiring member 11 can be made of a metal selected from the group including Cu, Ni, and Sn, an alloy including at least one type of metal selected from the group including Cu, Ni, and Sn, or the like.

Next, description is given of an example of a manufacturing method for solar cell module 1.

First, photoelectric conversion portions 20 are prepared. Next, metal oxide layer 16a and conductive layer 16b are stacked on n-type surface 12 of back surface 20a of each photoelectric conversion portion 20 while metal oxide layer 17a and conductive layer 17b are stacked on p-type surface 13.

Figure 6:
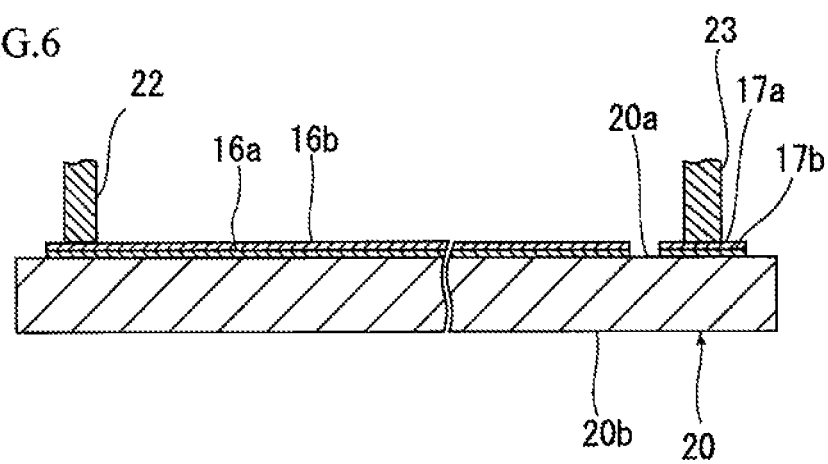
FIG. 6 is a schematic cross-sectional view for explaining a step of manufacturing the solar cell module of the first embodiment.

Next, as shown in FIG. 6, each photoelectric conversion portion 20 is submerged into a plating bath with power supply probes 22, 23 pressed against the surfaces of conductive layers 16b, 17b. Electroplating is then performed by supplying power from power supply probes 22, 23 and plating layers 16c, 17c are thereby formed. N-side electrode 14 and p-side electrode 15 are thus completed.

In this step of forming plating layers 16c, 17c, the plating layers are not formed to be thick in portions against which power supply probes 22, 23 are pressed and the thicknesses of the plating layers are large around the portions against which power supply probes 22, 23 are pressed. As a result power supplied points 18, 19 are formed.

Next, first bonding portions 11b of wiring member 11 are bonded to the regions including power supplied points 18 and second bonding portions 11c of wiring member 11 are bonded to the regions including power supplied points 19. P-side electrode 15 and n-side electrode 14 are thereby electrically connected to each other by wiring member 11. This process is repeated and solar cell string 9 is thereby manufactured.

Next, a resin sheet such as an EVA sheet is placed on second protection member 35. Then, multiple solar cell strings 9 electrically connected together by wiring are disposed on the resin sheet. A resin sheet such as an EVA sheet is placed on the multiple solar cell strings 9 and first protection member 34 is placed on the resin sheet. These parts are laminated together by being heated and pressed in a reduced atmosphere and solar cell module 1 is thereby manufactured.

As described above, in the embodiment, wiring member 11 is bonded to the multiple regions including power supplied points 18, 19 which are uneven. Due to this, the adhesion strength between wiring member 11 and n-side or p-side electrode 14, 15 can be improved. Accordingly, the reliability of solar cell module 1 can be improved.

Moreover, in the embodiment, since power supplied points 18, 19 are buried in adhesion layer 21 as bonding material, the adhesion strength between adhesion layer 21 and n-side or p-side electrode 14, 15 can be further improved. Accordingly, the reliability of solar cell module 1 can be further effectively improved. This effect can be similarly obtained also when a resin adhesive is used as the bonding material. Anisotropic conductive resin adhesive in which conductive particles are mixed can be preferably used as the resin adhesive.

Moreover, in the embodiment, wiring member 11 is discretely bonded to the multiple regions that include power supplied points 18, 19. This makes it less like for a stress to be applied to wiring member 11 compared to the case where wiring member 11 is bonded across the entire surfaces of bus bar portions 14a, 15a. Hence, delamination of wiring member 11 can be further effectively suppressed. Accordingly, the reliability of solar cell module 1 can be further effectively improved.

Moreover, power supplied points 18 and power supplied points 19 are provided asymmetric to each other. Specifically, each power supplied point 18 is provided not to be opposite to each power supplied point 19 in the x direction. Due to this, a large stress is less likely to be applied to a certain portion of wiring member 11. Hence, delamination of wiring member 11 can be more effectively suppressed. Accordingly, the reliability of solar cell module 1 is further effectively improved.

In the embodiment, power supplied points 19 of n-side electrode 14 collecting electrons which are majority carriers are smaller than power supplied points 18 of p-side electrode 15 collecting electron holes which are minority carriers. Due to this, the width of n-side bus bar portion 14a can be set smaller than the width of p-side bus bar portion 15a. Accordingly, recombination of the minority carriers near n-side bus bar portion 14a can be suppressed. As a result, higher photoelectric conversion efficiency can be achieved.

In the embodiment, wiring member 11 only needs to be bonded to regions including at least part of power supplied points 18, 19. The effects described above can be obtained even in this configuration.

Description is given below of other examples of preferable modes for carrying out the invention. In the description below, members having substantially the same functions as those in the first embodiment described above are referred to by the same reference numerals and description thereof is omitted.

Second Embodiment

FIG. 7 is a schematic plan view showing part of a solar cell string in a second embodiment.

In the first embodiment described above, description is given of the example in which power supplied points 18 and power supplied points 19 are provided asymmetric to each other. However, the invention is not limited to this configuration. For example, as shown in FIG. 7, power supplied points 18 and power supplied points 19 may be provided line symmetric to each other with respect to a center axis extending in a y direction. Specifically, in the embodiment, power supplied points 18 and power supplied points 19 which are the same in number are provided to be opposite to each other in an x direction. Like in the first embodiment, the adhesion strength between wiring member 11 and n-side or p-side electrode 14, 15 can be improved also in this configuration. Accordingly, the reliability of the solar cell module can be improved.

Other Modification Examples

In the first and second embodiments described above, description is given of the example in which each of n-side electrode 14 and p-side electrode 15 has multiple finger electrode portions 14b, 15b and bus bar portion 14a, 15a. However, the invention is not limited to this configuration. In the invention, the configuration may be such that at least one of the n-side electrode and p-side electrode has no bus bar and is a so-called bus-bar-less electrode formed of multiple finger portions. Moreover, in the case of the bus-bar-less electrode, at least one of the multiple finger portions may be formed in such a way that the finger portion is electrically connected to an electrode pad. In such case, it is preferable that the power supplied point is provided in the electrode pad.

In the first and second embodiments described above, description is given of the example in which wiring member 11 includes wiring member 11a, first bonding portions 11b, and second bonding portions 11c. However, the invention is not limited to this configuration. In the invention, the wiring member may be configured to have a linear shape.

In the first embodiment described above, description is given of the example in which three power supplied points 18 and four power supplied points 19 are provided, but the number of the power supplied points is particularly not limited in the invention. However, in the invention, it is preferable that about two to five power supplied points are provided in each of the n-side electrode and the p-side electrode. When the number of the power supplied points in each of the n-side electrode and the p-side electrode is too small, the effect of suppressing delamination of wiring member 11 may not be sufficiently obtained in some cases. Meanwhile, when the number of the power supplied points in each of the n-side electrode and the p-side electrode is too large, difference in the plating thickness between the center portion of each power supply point and the protruding portion at the outer periphery thereof may become small and thereby the delamination preventing effect may become small.

In the first embodiment described above, description is given of an example in which power supplied points 18, 19 are formed in bus bar portions 14a, 15a. However, the positions where the power supplied points are formed are particularly not limited in the invention. For example, the power supplied points may be formed in finger portions 14b, 15b.

EXPLANATION OF THE REFERENCE NUMERALS 1 solar cell module
9 solar cell string
10 solar cell
11 wiring member
11a wiring member main body
11b first bonding portion 11c second bonding portion
12 n-type surface
13 p-type surface
14 n-side electrode
15 p-side electrode
14a, 15a bus bar portion
14b, 15b finger portion
16a, 17a metal oxide layer
16b, 17b conductive layer
16c, 17c plating layer
18, 19 power supplied point
18a, 19a center portion
18b, 19b protruding portion
20 photoelectric conversion portion
21 adhesion layer
22, 23 power supply probe

The invention claimed is:

1. A solar cell module comprising:
solar cells each including a p-side electrode and an n-side electrode which are disposed on one main surface; and
a wiring member electrically connecting the p-side electrode of one of adjacent two of the solar cells and the n-side electrode of the other solar cell to each other, wherein
a surface layer of each of the p-side electrode and the n-side electrode is formed of a plating layer including one or plural power supplied points, and
the wiring member is bonded to regions, each including at least the power supplied point and wherein
the power supplied point includes: a center portion which is thinner than a portion other than the power supplied point; and a protruding portion which is located outside the center portion and which is thicker than the portion other than the power supplied point.

2. The solar cell module according to claim 1, wherein the wiring member includes:
a wiring member main body;
first bonding portions including the power supplied point that are electrically connected to the wiring member main body and each electrically connected to a region, including at least the power supplied point of the p-side electrode of the one of the adjacent two solar cells; and
second bonding portions electrically connected to the wiring member main body and each electrically connected to the region, including at least the power supplied point, of the n-side electrode of the other one of the adjacent two solar cells.

3. The solar cell module according to claim 1, wherein
the plural power supplied points are formed in the plating layer of each of the p-side electrode and the n-side electrode, and
each power supplied point in the p-side electrode of the one of the adjacent two solar cells and each power supplied point in the n-side electrode of the other solar cell are arranged not to be opposite to each other.

4. The solar cell module according to claim 1, wherein the one or plural power supplied points in the p-side electrode and the one or plural power supplied points in the n-side electrode are arranged to be symmetric to each other.

5. The solar cell module according to claim 1, wherein the one or plural power supplied points in the p-side electrode and the one or plural power supplied points in the n-side electrode are arranged to be asymmetric to each other.

6. The solar cell module according to claim 1, wherein the plural power supplied points are formed at equal intervals in the plating layer of each of the p-side electrode and the n-side electrode.

7. The solar cell module according to claim 1, wherein
each of the p-side electrode and the n-side electrode includes a bus bar portion and a plurality of finger portions extending from the bus bar portion, and
the one or plural power supplied points are formed in the bus bar portion.

8. The solar cell module according to claim 1, wherein each power supplied point of one of the p-side electrode and the n-side electrode which collects majority carriers is formed to be smaller than each power supplied point of the other of the p-side electrode and the n-side electrode which collects minority carriers.

9. The solar cell module according to claim 7, wherein the bus bar portion of one of the p-side electrode and the n-side electrode which collects majority carriers is formed to have a width smaller than the bus bar portion of the other of the p-side electrode and the n-side electrode which collects minority carriers.

10. The solar cell module according to claim 1, further comprising an adhesion layer bonding the wiring member and the solar cells together.

* * * * *